United States Patent [19]

Yokoyama et al.

[11] Patent Number: 5,286,977
[45] Date of Patent: Feb. 15, 1994

[54] POSITIONING DEVICE

[75] Inventors: Kazuo Yokoyama; Motoshi Shibata, both of Hirakata, Japan

[73] Assignee: Matsushita Electric Industrial Co., Ltd., Kadoma, Japan

[21] Appl. No.: 8,804

[22] Filed: Jan. 25, 1993

[30] Foreign Application Priority Data

Jan. 23, 1992 [JP] Japan .................................. 4-010216

[51] Int. Cl.⁵ .............................................. H01J 37/20
[52] U.S. Cl. ................................. 250/442.11; 250/306; 73/105
[58] Field of Search ........................... 250/442.11, 306; 73/105

[56] References Cited

U.S. PATENT DOCUMENTS 4,908,519  3/1990  Park et al. ...................... 250/442.11
4,947,042  8/1990  Nishioka et al. ................ 250/442.11
5,103,095  4/1992  Elings et al. .................... 250/442.11

Primary Examiner—Jack I. Berman
Attorney, Agent, or Firm—Fish & Richardson

[57] ABSTRACT

Disclosed is a positioning device comprising an X-Y scanning mechanism capable of scanning and driving in planar directions and a Z-scanning mechanism capable of scanning and driving in a direction perpendicular to the planar directions. A sample table is affixed to the moving part of the Z-scanning mechanism, and the housing of the probe head is fixed to the casing of the positioning device through a plate spring. The housing abuts against a plane formed in the moving part of the X-Y scanning mechanism through three point contact legs such that the resonance frequency of the entire device can be set high, thereby realizing a high anti-vibration effect and stable probe scanning. The housing of the probe head abuts against said plane formed in the moving part of the X-Y scanning mechanism through three ball bearings composing the three point contact legs, and is mounted on the fixed table through a thin plate spring.

17 Claims, 5 Drawing Sheets

POSITIONING DEVICE

FIELD OF THE PRESENT INVENTION

The present invention relates to a positioning device used in scanning tunneling microscopes (STM), atomic force microscopes (AFM), other scanning probe microscopes or their applied apparatuses.

BACKGROUND OF THE INVENTION

Recently, the scanning tunneling microscope (STM) has been developed for resolving the composition of a sample surface down to the atomic level.

The measuring principle of the STM is described below.

Above the sample surface to be measured, a probe made of an extremely sharp pointed metal needle is brought within a distance of about 10 angstroms, and a bias voltage of about 10 mV to 2 V is applied between sample and probe, with a tunneling current of several nA then flowing. The tunneling current is very sensitive to the distance between sample and probe; therefore, this distance may be kept constant by employing feedback control.

The probe is attached to an actuator composed of piezo elements capable of inching movement in three axial directions, X, Y and Z. When a raster scan is directed by moving sample and probe relatively in the planar X-Y direction, the distance between sample and probe is kept constant by feedback control to the Z direction. Incidentally, the change in voltage applied to the position control of the Z direction directly expresses the asperities of the sample surface.

Such STM technology is producing peripheral technologies like the atomic force microscope (AFM), near field optical microscope (NFOM) and superprecision processing machines capable of manipulating atoms and molecules. These technologies commonly employ the method of scanning the sample surface while maintaining the distance between sample and probe at the atomic level. Including the observation apparatuses, the above-noted apparatuses are commonly called near field microscopes (NFM) or scanning probe microscopes (SPM).

While maintaining a distance between probe and sample at an atomic level, the sample surface can be scanned by thoroughly eliminating mechanical vibrations affecting distance fluctuations. Thus, the foremost consideration of a positioning device of the invention should be the elimination of mechanical vibrations.

Moreover, when the STM is used to analyze a semiconductor element, superlattice quantum effect device or the like, the positioning mechanism is necessary to locate a specific position of the sample. Furthermore, for a superprecision processing machine utilizing STM technology, a positioning device of high accuracy is needed to control X-Y position coordinates.

As an example of a simple positioning function of a STM used in an air environment, without installation of a specific positioning device, the probe head with the scanning probe was manually moved while observing sample and scanning probe from an oblique direction by an optical microscope.

Moreover, as an example of a positioning device for a STM used in a vacuum, the sample was positioned by a worm-type driving device while observing sample and scanning probe from an oblique direction with a scanning electrochemical microscope (SEM).

Although in the conventional STM, however high in precision the absolute positioning function of the X-Y position coordinates of sample and scanning probe may be, so far as the mechanical vibrations cannot be eliminated completely, it is insufficient for accurate X-Y positioning.

When scanning at a distance of an atomic level from the scanning probe to the sample, mechanical vibrations affecting the fluctuations of distance must be thoroughly eliminated. In the conventional positioning device, however, it is difficult to satisfy both vibration control and accurate X-Y positioning.

SUMMARY OF THE INVENTION

To solve the above problems, it is hence a primary objective of the invention to present a positioning device high in mechanical stability during probe scanning, capable of positioning the X-Y coordinates at superhigh precision, and applicable to the scanning probe microscope or its applied apparatus.

To achieve the above-noted objective, the invention presents a positioning device comprising an X-Y scanning mechanism capable of scanning and driving in planar directions, and a Z-scanning mechanism capable of scanning and driving in a direction perpendicular to planar directions. Said Z-scanning mechanism is disposed in the moving part of the X-Y scanning mechanism, wherein a sample table is fixed to the moving part of the Z-scanning mechanism, and wherein the housing of the probe head is mounted on the casing of the positioning device through a plate spring, and abuts against the plane formed in the moving part of the X-Y scanning mechanism through three point contact legs.

The invention also presents a positioning device as in the above description, but where the housing of the probe head is mounted on the moving part of the X-Y scanning mechanism through a plate spring, and abuts against the plane formed in the casing of the positioning device through three point contact legs.

In the above constitutions, it is preferable that the orientation of the plate spring is axis symmetrical to the center shaft of the probe head.

It is also preferable that a vibration dampening material is adhered to the plate spring.

According to the first embodiment of the invention, the housing of the probe head is mounted on the casing of the positioning device through a plate spring and abuts against the plane formed in the moving part of the X-Y scanning mechanism through three point contact legs. As a method of controlling vibration affecting distance fluctuations between probe and sample, the resonance frequency of the entire mechanism can be set extremely high, thereby realizing stable probe scanning.

The housing of the probe head is supported by a plate spring to abut against the plane formed in the moving part of the X-Y scanning mechanism, thereby maintaining the stability of the three point contact legs. The probe head can also be rigidly fixed against movement in the X-Y direction. Accordingly, in employing the absolute positioning mechanism for the X-Y scanning mechanism, displacement errors such as backlash of the drive transmission system are decreased, and the relative positions of the sample and probe may be easily and precisely determined.

The X-Y scanning mechanism of the invention can be directly employed as the X-Y driving table generally used as a mechanical positioning device and as a basic structure. Therefore, it is easier to design and manufacture various STMs applying the positioning device of the invention, and this product may be priced lower and reduced in size.

According to the second embodiment of the invention, the housing of the probe head is mounted on the moving part of the X-Y scanning mechanism through a plate spring, and abuts against the plane formed in the casing of the positioning device through three point contact legs. In order to control vibration affecting the distance fluctuations between probe and sample, the resonance frequency of the entire mechanism can be set extremely high, thereby realizing stable probe scanning.

The housing of the probe head is supported by a plate spring to abut against the plane formed in the casing of the positioning device, thereby maintaining the stability of the three point contact legs. The probe head can also be rigidly fixed against movement in the X-Y direction. Accordingly, in employing the absolute positioning mechanism for the X-Y scanning mechanism, displacement errors such as backlash of the drive transmission system are decreased, and the relative positions of sample and probe may be easily and precisely determined.

In the first embodiment, the X-Y scanning mechanism for inching sample in planar directions, and the Z-scanning mechanism for inching sample in a perpendicular direction to X-Y movement are formed in one body. In the second embodiment, however, the X-Y and Z-scanning mechanisms are fixed to the casing of the positioning device independently from each other, thereby simplifying the entire mechanism as well as the manufacture and assembly of the positioning device.

In both embodiments, the orientation of the plate spring is axis-symmetrical to the center shaft of the probe head. As a result, even in case that thermal drift originating in thermal expansion or the like of members composing the positioning device is generated, thermal expansion effects around the center of the plate spring are canceled and displacement of the probe head in the X-Y direction can be minimized.

Yet, in both embodiments, since a vibration dampening material is adhered to the plate spring, positional fluctuations in the X-Y direction due to resonance of the spring itself may be minimized.

DETAILED DESCRIPTION OF THE INVENTION

Figure 1:
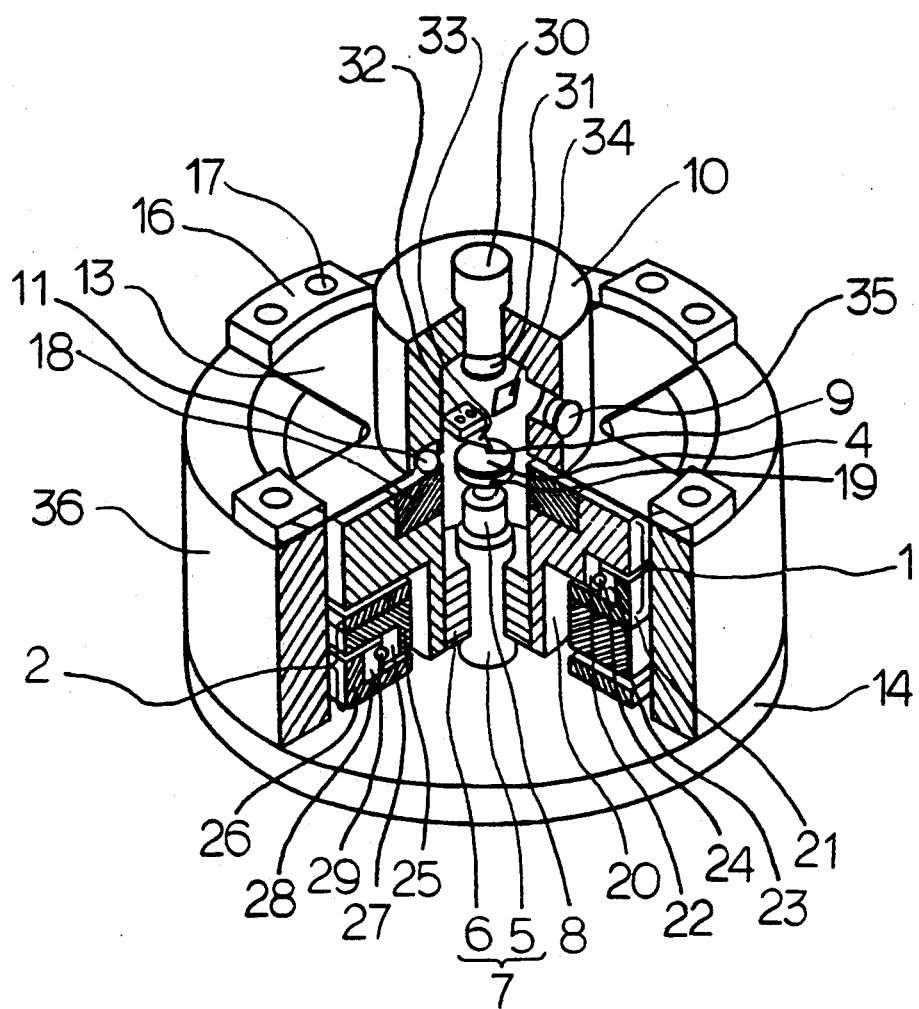
FIG. 1 is a partial cut-away perspective view showing an embodiment of a positioning device of the invention.

Referring now to the drawings, some of the embodiments of the invention are described in detail below.

Figure 2:
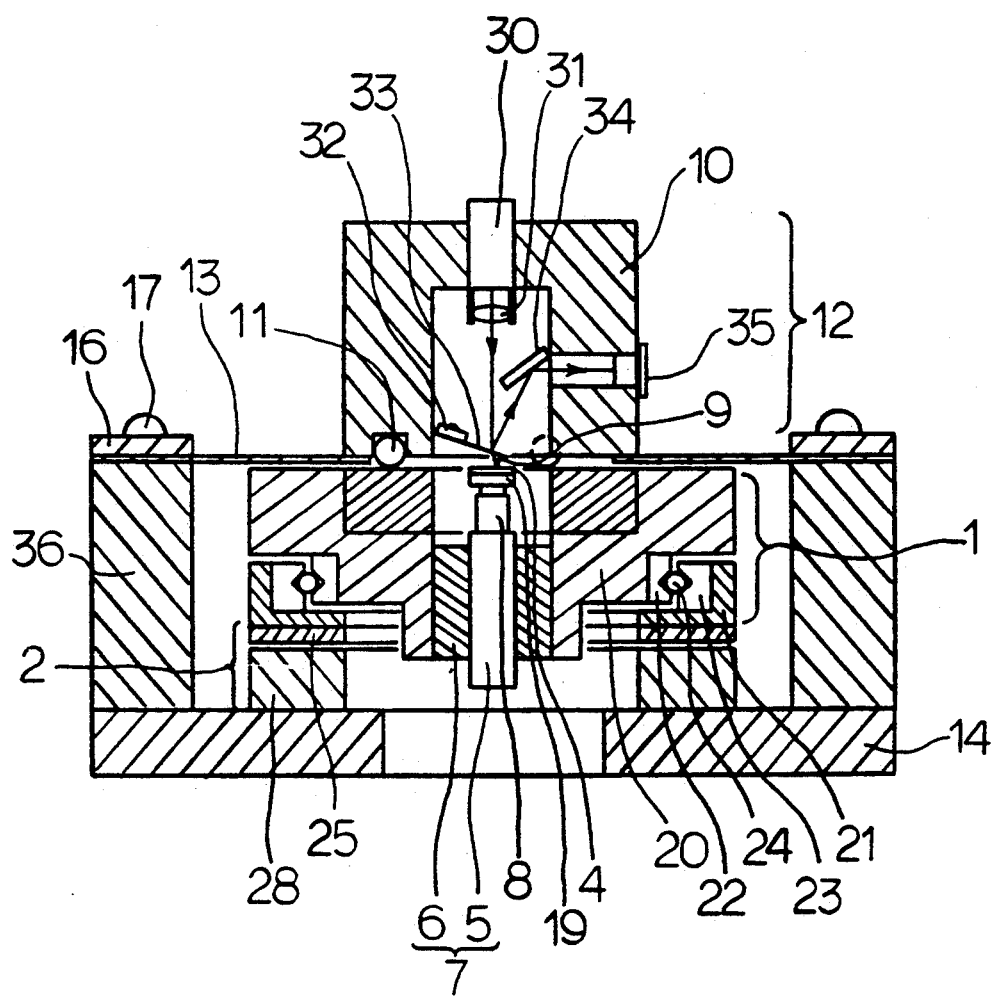
FIG. 2 is a central cross-sectional view showing the same embodiment of a positioning device of the invention.
Figure 3:
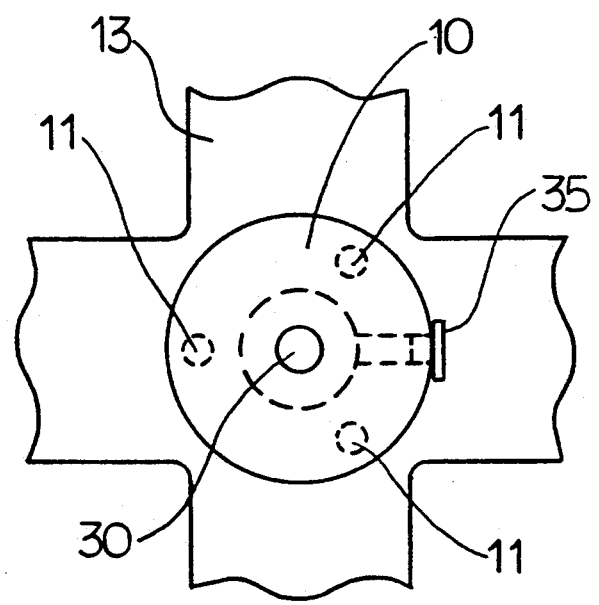
FIG. 3 is a partial plan view in the vicinity of the probe head of the same embodiment of a positioning device of the invention.

FIG. 1 is a partial cut-away perspective view showing an embodiment of a positioning device of the invention. FIG. 2 is its central cross-sectional view. FIG. 3 is a partial plan view in the vicinity of the probe head. The embodiment is an example of a positioning device for an atomic force microscope/scanning tunneling microscope combination microscope (AFM/STM) and fine surface processing apparatus applying these principles, but may also be applied to other STMs.

On a base 14, a Y-axis drive unit (Y-axis drive table) 2 is mounted, and an X-axis drive unit (X-axis drive table) 1 is mounted on this Y-axis drive unit 2, thereby composing a complete X-Y scanning mechanism (X-Y table).

Furthermore, a sample table 19 is fixed to an upper member 20 corresponding to the moving part of the X-Y scanning mechanism through a Z-axis scanning driving device as well as a scanner 8 for X-Y scanning and Z-axis inching. More specifically, sample table 19 is fixed through a worm-type drive unit (inch worm drive unit) 7, comprising a columnar movable shaft 5 and a cylindrical fixed shaft 6, and cylindrical scanner 8. On sample table 19, a sample 4, such as a piece of Si wafer or GaAs wafer, is fixed. Commercial products, using piezo elements such as PZT piezoelectric elements (lead zirconate titanate piezoelectric elements), can be employed for worm-type drive unit 7 and cylindrical scanner 8.

X-axis drive unit 1 comprises upper member 20 and a lower member 21. Upper member 20 possesses a rail 22, which is straight and has a V-section groove; lower member 21 also possesses a rail 23 having a similar V-section groove. A ball bearing 24 is inserted between rails 22 and 23, so that upper member 20 and lower member 21 may slide in the X-axis direction parallel to one another. Lower member 21 is fixed to an upper member 25 of the Y-axis drive unit 2 mentioned below.

Y-axis drive unit 2 similarly comprises upper member 25 and a lower member 26. Upper member 25 possesses a rail 27 having a V-section groove, and lower member 26 also possesses a rail 28 having a V-section groove. A ball bearing 29 is inserted between rails 27 and 28, so that upper member 25 and lower member 26 may slide in the Y-axis direction parallel to one another. Herein, the stepping motor, inch worm motor, other driving sources and drive transmission mechanism such as a ball screw are of the known art, and are omitted in the drawings and explanations.

The probe head in the embodiments employs the following methods in order to detect the atomic force acting between sample and probe and the tunneling current flowing between sample and probe.

When detecting the atomic force, a tiny cantilever 33 equipped with a probe 9 is deflected by receiving a force acting between probe 9 and sample 4. The deflection of cantilever 33 can be sensed by a detecting mechanism of the optical lever type, thereby detecting the atomic force. More specifically, a ray of light from a semiconductor laser source 30 fixed in a housing 10 of a probe head 12 is concentrated by a focusing lens 31, and is transmitted to cantilever 33 equipped with probe 9 (cantilever 33 is attached to housing 10 through a fixing plate 32). The ray of light reflected by cantilever 33 is reflected by a mirror 34, and is received by a two-division photo detector 35. When cantilever 33 is deflected by the action of the atomic force, the two outputs of photo detector 35 are imbalanced; for example, by mutually subtracting and converting to the degree of deflection of cantilever 33, the magnitude of the atomic force may be measured.

In detecting the tunneling current, a bias voltage is applied between sample 4, such as a conductor, semiconductor or the like, and conductive probe 9 fixed to the end of cantilever 33; sample 4 and probe 9 are brought closer together, thereby generating and detecting the tunneling current.

Probe head 12 is explained below. The outer appearance of housing 10 of probe head 12 is axis-symmetrical in an approximately cylindrical shape, and three ball bearings 11 are provided in the leg sections of housing 10, thereby forming three point contact legs.

Upper member 20 corresponding to the moving part of the X-Y scanning mechanism is equipped with sample table 19 and a holed disc 18 having an abutting plane for mounting the three point contact legs of probe head 12. Probe head 12 is mounted in contact with said plane of holed disc 18 through the three point contact legs.

Housing 10 of probe head 12 is mounted on a fixing table 36, which is the casing of the positioning device, through a plate spring 13 disposed parallel to the abutting plane. Plate spring 13 is attached to fixing table 36 by a screw 17 through a fixing plate 16. Thus, probe head 12 is mounted on fixing table 36 through plate spring 13, thereby defining motion in the X-Y direction. Therefore, in driving the X-Y scanning mechanism, the relative position between housing 10 and sample table 19 fixed to the moving part of the X-Y scanning mechanism can be defined while using the abutting plane as the sliding surface.

Holed disc 18 is preferably made of quartz, and the abutting plane preferably should be an optical flat. For plate spring 13, a plate of stainless steel or iron-nickel alloy (Fe-36% Ni) with a low coefficient of thermal expansion in a thickness of 0.05 to 0.3 mm is desired. It is also preferable that the plate be disposed axis-symmetrically. In replacing sample 4, probe head 12 together with plate spring 13 is dismounted after removing screws 17.

As explained herein, the restraining means of the moving body (probe head 12), combined with the three point contacts and plate spring, can be applied conveniently for a scanning probe microscope or its applied apparatus. When probe head 13 is unrestrained, a total of six degrees of freedom is achieved, including the translation motion in three directions of X, Y, Z, and rotary motions around the X, Y, Z axes. However, in controlling the relative position of sample 4 and probe head 13 by three point contacts, three degrees of freedom are possible, consisting of the X-Y direction and the rotary motion around the Z-axis of the sample plane. Thus in this case, other motions are restrained.

The flat plate spring is easily deflected in a direction perpendicular to the plane, but is extremely rigid in a direction parallel to its flat surface. By making use of this condition to restrain the other degrees of freedom, the total degree of freedom of probe head 12 can be restrained without reducing the stability of the three point contacts.

As a result, probe head 12 can be mechanically coupled at three positions close to the scanning point of sample 4; probe head 12 can therefore be set at a high resonance frequency, obtaining an extremely high anti-vibration effect as the mechanism of stably scanning the atomic order asperities on the surface of sample 4.

Generally, in realizing Z-axis control at the atomic level, mechanical vibrations must be controlled within 0.01 angstrom or less when measuring an atom of about 1 angstrom in diameter. When mounting a probe head on a base through an X-Y drive unit, however, it is difficult to obtain a high anti-vibration effect. This is because the resonance frequency is reduced by the effects of members low in stiffness among the entire apparatus construction, such as beam structure and the X-Y drive unit.

By contrast, according to the constitution of the invention, by setting the probe head at a high resonance frequency, the resonance frequency of the entire system can be set high. Furthermore, a scanning probe microscope is generally installed on a vibration-proof device such as an air spring, and the high resonance frequency is cut off by the vibration-proof device. Therefore, by enhancing the resonance frequency of the entire system, a high anti-vibration performance is obtained by these synergistic effects.

Figure 4:
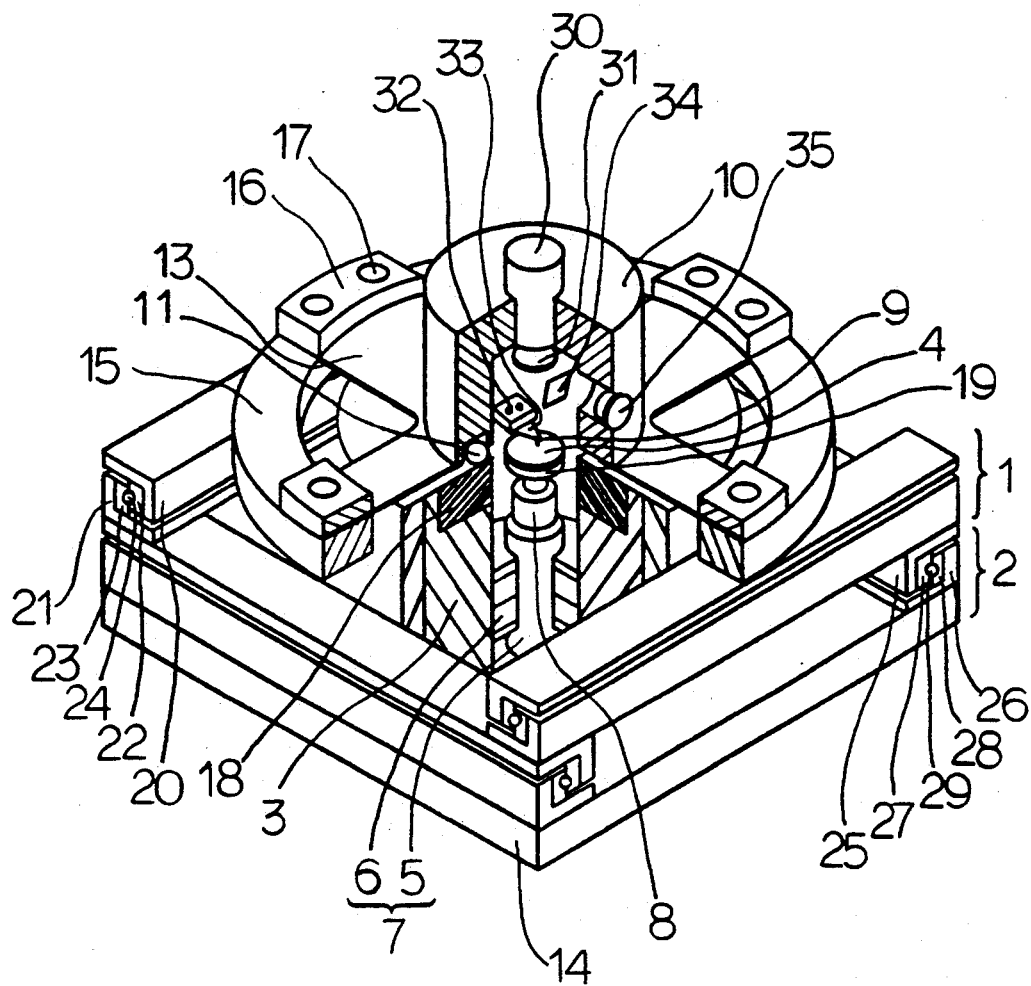
FIG. 4 is a partial cut-away perspective view showing another embodiment of a positioning device of the invention.
Figure 5:
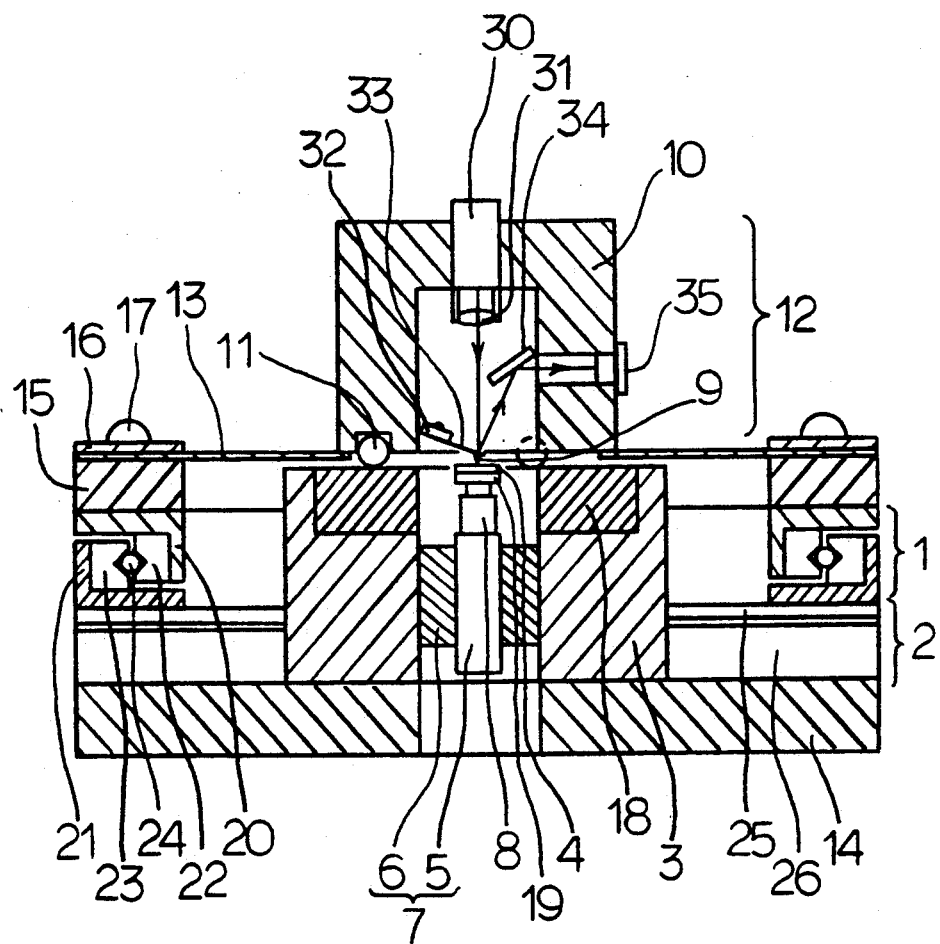
FIG. 5 is a central cross-sectional view showing the same embodiment of a positioning device of the invention.

FIG. 4 is a partial cut-away perspective view showing another embodiment of a positioning device of the invention, and FIG. 5 is its central cross-sectional view.

The entire construction and function of this embodiment are the same as shown in FIGS. 1 and 2, except that a housing 10 of a probe head 12 is fixed to the moving part of the X-Y scanning mechanism through a thin plate spring 13, and that the Z-scanning mechanism to which the sample table is fixed is installed independently of the X-Y scanning mechanism.

On a base 14, a Y-axis drive unit 2 is mounted, and an X-axis drive unit 1 is mounted thereon, thereby forming an X-Y scanning mechanism. X-axis drive unit 1 is comprised of an upper member 20 possessing a rail 22 with a V-section groove, and a lower member 21 possessing a rail 23 similarly with a V-section groove. A ball bearing 24 is inserted between rails 22 and 23, thus allowing upper member 20 and lower member 21 to slide in the X-axis direction parallel to each other. In Y-axis drive unit 2, similarly, an upper member 25 and a lower member 26 slide in the Y-axis direction parallel to each other, and lower member 21 of X-axis drive unit 1 and upper member 25 of Y-axis drive unit 2 are fixed to each other.

Nearly at the center of base 14, a cylindrical fixing table 3 integrated with the casing of the main body is fixed. A sample table 19 is fixed to table 3 through a worm-type drive unit 7, comprised of a columnar movable shaft 5 and a cylindrical fixed shaft 6, and a cylindrical scanner 8.

Housing 10 of probe head 12 is, in its outer appearance, an axis-symmetrical structure approximately in a cylindrical shape. Three ball bearings 22 are provided in the legs of housing 10, thereby forming three point contact legs and placing probe head 12 in contact with the abutting plane of a holed disc 18 provided in the fixed table 3.

Housing 10 is linked to upper member 20 of X-axis drive unit 1 through plate spring 13 disposed parallel to the abutting plane. Plate spring 13 is fixed to upper member 20 by a screw 17 through a fixing plate 16.

Thus probe head 12 is fixed to upper member 20 through plate spring 13. While employing the abutting plane as a sliding surface, the relative position between sample table 19 and probe head 12 can be defined by driving the X-Y scanning mechanism.

By employing such construction, as compared with the constitution shown in FIGS. 1 and 2, the entire mechanism is simplified, and manufacturing and assembling the positioning device may be much easier. A similar anti-vibration performance may also be achieved.

In the foregoing embodiments, it is preferable that the orientation of plate spring 13 be formed axis-symmetrically to the center shaft of probe head 12. Even if thermal drift due to thermal expansion of the members comprising the positioning device occurs, the effects of such expansion near the center of plate spring 13 may be canceled by employing this type of plate. Hence, the displacement of probe head 12 in the X-Y direction can be minimized.

It is also preferable in each embodiment that the members comprising the device—in particular housing 10, fixed table 3, X and Y drive units 1 and 2, plate spring 13 and base 14—are made of materials with a low coefficient of thermal expansion such as iron-nickel alloy (Fe-36% Ni). Thus, with the effects of axis-symmetry of plate spring 13, a very high thermal stability is realized.

Incidentally, if the positioning device of the foregoing embodiments is used in a normal air atmosphere, the acoustic vibration propagating in air affects plate spring 13, thereby inducing slight vibrations in the X-Y direction. However, practically harmful vibrations can be prevented by adhering a vibration dampening material—such as synthetic rubber, preferably vulcanized fluorine-based rubber such as "Viton" (from DuPont), of a thickness of about 0.5 mm—to the surface of plate spring 13.

In each embodiment, the positioning device applied in the scanning tunneling microscope (STM), atomic force microscope (AFM), and their applied processing apparatuses was described; the positioning device is also useful for various observation appliances and processing devices deriving from the STM or AFM.

As described above, the housing of probe head 12 is supported by the plate spring to abut against the abutting plane through three point contact legs. Therefore, the positioning device of the invention can set the resonance frequency of the entire mechanism at a very high level in scanning the relative distance between the housing and sample. In addition to a high anti-vibration effect, stable probe scanning can also be realized.

Since the orientation of the plate spring is axis-symmetrical to the center shaft of the probe head, thermal drift due to thermal expansion or the like of the members comprising the positioning device may be effectively prevented.

Moreover, as the vibration dampening material is adhered to the plate spring, positional variations in the X-Y direction due to resonance of the plate spring itself may be effectively controlled.

The invention may be embodied in other specific forms without departing from the spirit or essential characteristics thereof. The present embodiment is to be considered in all respects as illustrative and not restrictive, the scope of the invention being indicated by the appended claims rather than by the foregoing description and all changes which come within the meaning and range of equivalency of the claims are intended to be embraced therein.

We claim:

1. A positioning device comprising an X-Y scanning mechanism capable of scanning and driving in planar directions and a Z-scanning mechanism capable of scanning and driving in a direction perpendicular to the planar directions, said Z-scanning mechanism being disposed in the moving part of said X-Y scanning mechanism, wherein a sample table is fixed to the moving part of said Z-scanning mechanism, and wherein the housing of a probe head is mounted on the casing of the positioning device through a plate spring, thereby abutting against the plane formed in the moving part of said X-Y scanning mechanism through three point contact legs.

2. The positioning device according to claim 1, wherein the orientation of the plate spring is axis-symmetrical to the central shaft of the probe head.

3. The positioning device according to claim 1, wherein a vibration dampening material is adhered to the plate spring.

4. The positioning device according to claim 3, wherein the vibration dampening material is synthetic rubber.

5. The positioning device according to claim 1, wherein a sample table is fixed to the upper member corresponding to the moving part of the X-Y scanning mechanism through the Z-axis scanning drive unit as well as the scanner for X-Y scanning and Z-axis inching.

6. The positioning device according to claim 1, wherein the sample table is installed through an inch worm drive unit, comprising a columnar movable shaft and cylindrical fixed shaft, and a cylindrical scanner.

7. The positioning device according to claim 6, wherein the worm-type drive unit and cylindrical scanner are made of piezo elements such as lead zirconate titanate piezoelectric elements.

8. The positioning device according to claim 1, wherein three point contact legs are ball bearings placed in rail grooves.

9. The positioning device according to claim 1, wherein the plate spring is made of a stainless steel or iron-nickel alloy with a low coefficient of thermal expansion.

10. The positioning device according to claim 1, wherein the housing, X-Y drive unit and plate spring are made of an iron-nickel alloy with a low coefficient of thermal expansion.

11. A positioning device comprising an X-Y scanning mechanism capable of scanning and driving in planar directions and a Z-scanning mechanism capable of scanning and driving in a direction perpendicular to the planar directions, said Z-scanning mechanism being disposed in the moving part of the X-Y scanning mechanism, wherein a sample table is fixed to the moving part of the Z-scanning mechanism, and wherein the housing of the probe head is fixed to the moving part of the X-Y scanning mechanism through a plate spring, thereby abutting against the plane formed in the casing of the positioning device through three point contact legs.

12. The positioning device according to claim 1, wherein the orientation of the plate spring is axis-symmetrical to the central shaft of the probe head.

13. The positioning device according to claim 1, wherein a vibration dampening material is adhered to the plate spring.

14. The positioning device according to claim 13, wherein the vibration dampening material is synthetic rubber.

15. The positioning device according to claim 11, wherein three point contact legs are ball bearings placed in rail grooves.

16. The positioning device according to claim 11, wherein the plate spring is made of a stainless steel or iron-nickel alloy with a low coefficient of thermal expansion.

17. The positioning device according to claim 11, wherein the housing, X-Y drive unit and plate spring are made of an iron-nickel alloy with a low coefficient of thermal expansion.

* * * * *